(12) United States Patent
Jaussi et al.

(10) Patent No.: US 7,345,605 B2
(45) Date of Patent: Mar. 18, 2008

(54) PULSE AMPLITUDE-MODULATED SIGNAL PROCESSING

(75) Inventors: James E. Jaussi, Hillsboro, OR (US); Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1079 days.

(21) Appl. No.: 10/325,097

(22) Filed: Dec. 20, 2002

(65) Prior Publication Data

US 2004/0119627 A1      Jun. 24, 2004

(51) Int. Cl.
    *H03M 3/00*    (2006.01)
(52) U.S. Cl. .................................. 341/143; 341/144
(58) Field of Classification Search ................ 341/143, 341/155, 200, 144
    See application file for complete search history.

(56) References Cited

U.S. PATENT DOCUMENTS 6,473,019 B1 *  10/2002  Ruha et al. ................. 341/143
6,947,513 B2 *  9/2005   O'Toole et al. ............. 375/374

OTHER PUBLICATIONS

Farjad-Rad, Ramin et al., "A 0.3-μm CMOS 8-Gb/s 4-PAM Serial Link Transceiver", IEEE Journal of Solid-State Circuits, vol. 35, No. 5, May 2000, 0018-9200. p. 757-764.
Farjad-Rad, Ramin et al., "An Equalization Scheme for 10Gb/s 4-PAM Signaling over Long Cables", Jul. 28, 1997. 17pgs.

* cited by examiner

*Primary Examiner*—Rexford Barnie
*Assistant Examiner*—Joseph Lauture
(74) *Attorney, Agent, or Firm*—Buckley, Maschoff & Talwalkar LLC

(57) ABSTRACT

According to some embodiments, a circuit includes a current mirror to receive a multi-level current signal, and to generate a plurality of current signals substantially identical to the multi-level current signal. Such a circuit may also include a plurality of current comparison circuits, each of the plurality of current comparison circuits to receive a respective one of the plurality of generated current signals, to receive a respective reference current signal, and to generate a signal indicating a relationship between the received respective one of the plurality of generated current signals and the respective reference current signal.

15 Claims, 4 Drawing Sheets

PULSE AMPLITUDE-MODULATED SIGNAL PROCESSING

BACKGROUND

Circuit designers rely on several different techniques to increase the rate at which data can be transmitted between devices. According to one such technique, designers add I/O pins to the devices so as to increase a physical width of a bus used to transmit the data. In another technique, designers increase the frequency of a clock used to define a beginning and an end of a data bit. Adding I/O pins increases device size, device cost, testing cost, and power consumption, and otherwise decreases electrical performance. On the other hand, increasing a clock frequency requires simultaneous and costly improvements in development, manufacturing, and testing processes and also increases electrical losses.

Multi-level signaling is a technique used to address some of the foregoing shortcomings. According to conventional two-level signaling, one bit is transmitted for each falling clock edge. In the case of an amplitude-modulated signal, the value of the bit is 0 or 1 depending upon whether an amplitude of the signal during the most-recent clock period was greater than or less than a reference voltage. An amplitude of a multi-level signal during a clock period, in contrast, may be compared with one or more reference voltages to determine that the amplitude represents one of three or more signal levels. Therefore, for a given data rate, a four-level (two bit) signal scheme can reduce the symbol rate by one half over a two-level scheme, decrease intersymbol interference in the data bus, and decrease a maximum required clock frequency.

DETAILED DESCRIPTION

Figure 1:
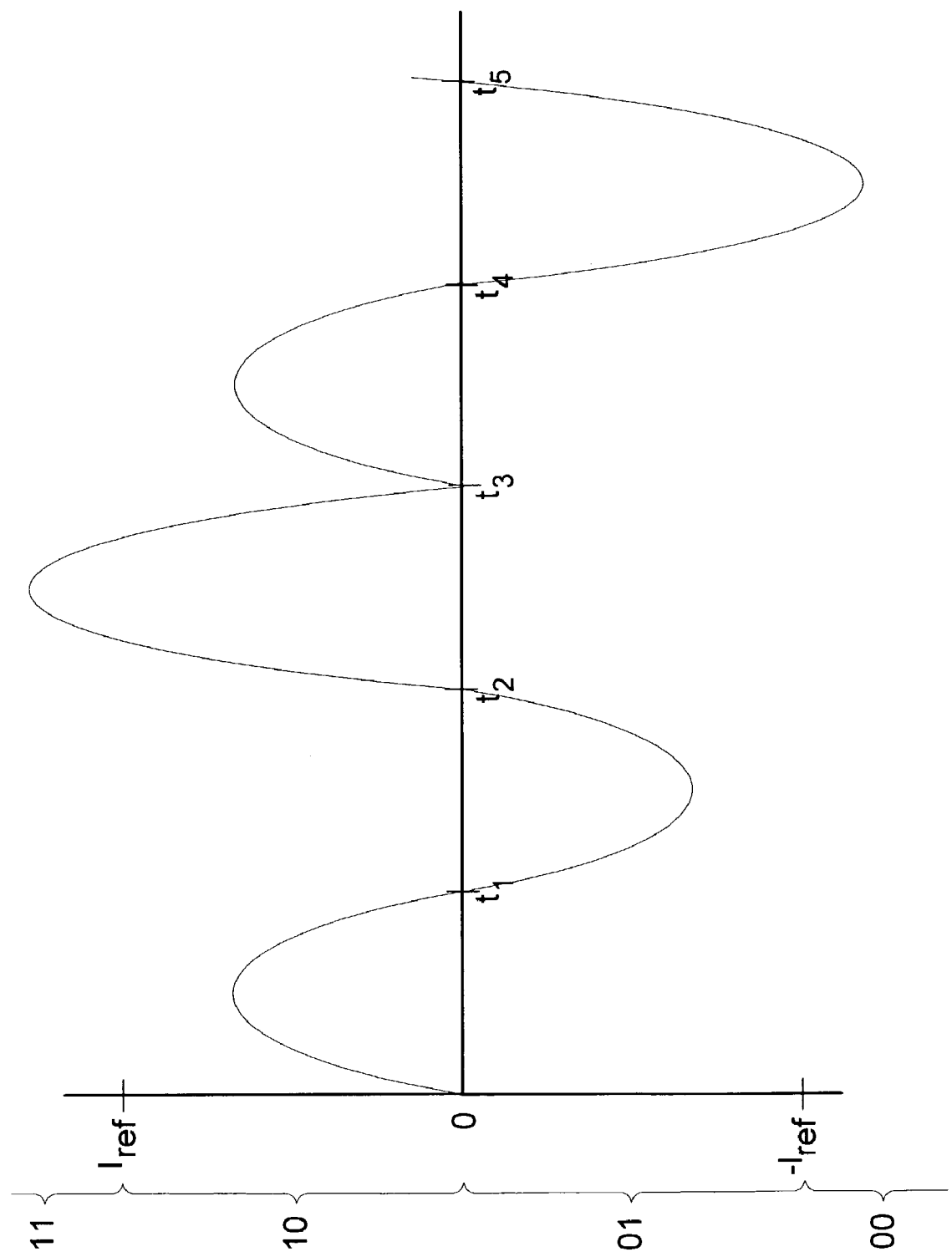
FIG. 1 is a diagram illustrating a multi-level signaling scheme according to some embodiments.

FIG. 1 illustrates a multi-level current signal over several clock cycles. According to some embodiments, reference current levels $I_{ref}$ and $-I_{ref}$ are used to determine data bits encoded by the multi-level current signal. For example, an amplitude of the current signal over a clock period is determined to represent a particular two-bit data value based on a relationship of the amplitude to current reference levels $I_{ref}$ and $-I_{ref}$. The data value is "00" for amplitudes less than $-I_{ref}$, "01" for amplitudes between $-I_{ref}$ and 0, "10" for amplitudes between 0 and $I_{ref}$, and "11" for amplitudes greater than $I_{ref}$. Accordingly, these data values may be determined by comparing the current signal with a plurality of reference current signals. Moreover, the data values may be initially encoded by a multi-level voltage signal that is converted to the multi-level current signal shown in FIG. 1.

Figure 2:
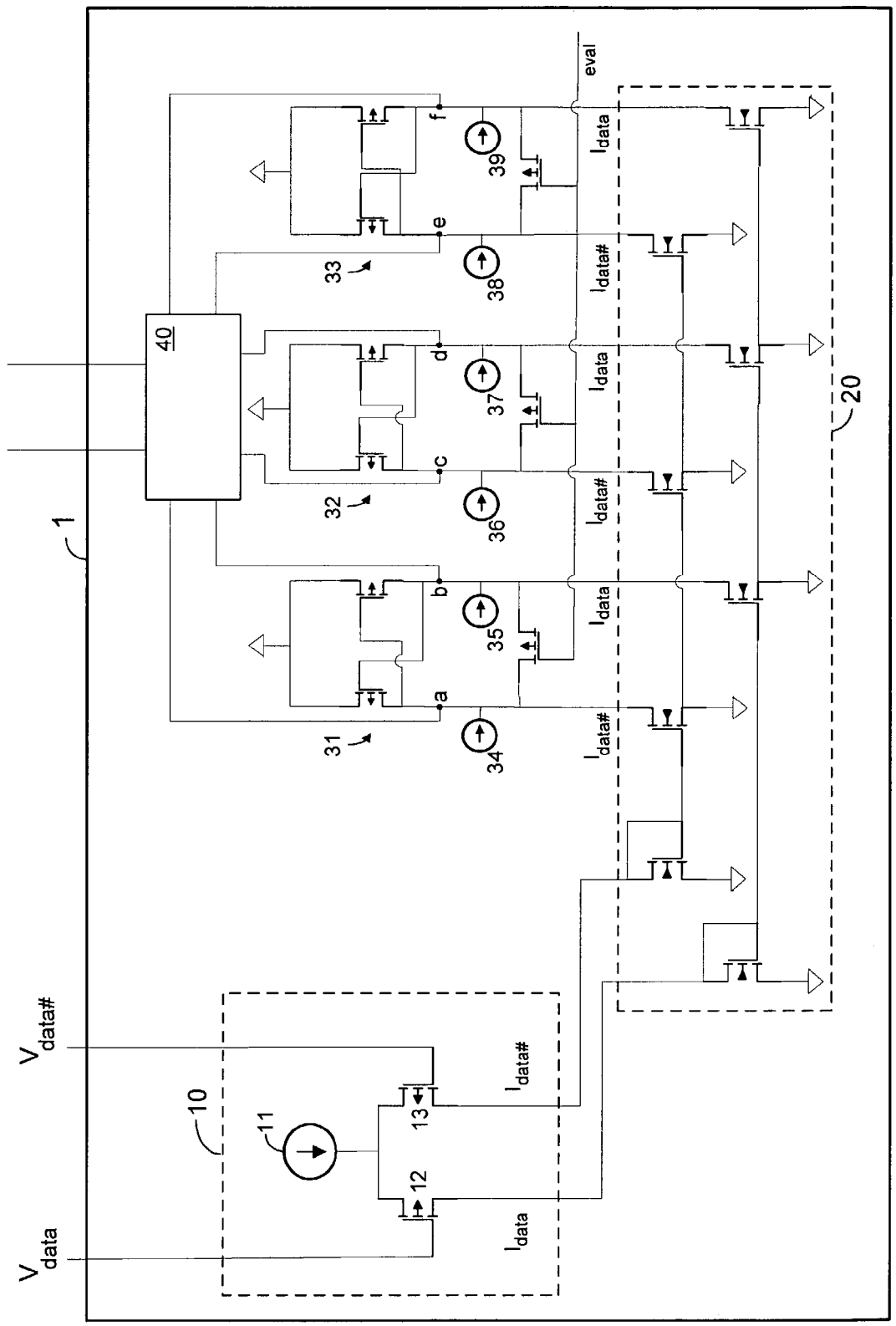
FIG. 2 is a diagram illustrating elements of a multi-level signal receiver according to some embodiments.

FIG. 2 illustrates elements of a multi-level signal receiver according to some embodiments. As shown, receiver 1 includes voltage-to-current converter 10, n-channel current mirror 20 and p-channel latches 31 through 33.

Voltage-to-current converter 10 is adapted to receive a differential-mode multi-level voltage signal represented by differential voltage signals $V_{data}$ and $V_{data\#}$. According to the present example, the multi-level voltage signal encodes data according to a 4-PAM signaling scheme. Voltage-to-current converter 10 includes bias current source 11 coupled to a source of p-channel metal oxide semiconductor (PMOS) transistor 12. Bias current source 11 is also coupled to a source of PMOS transistor 13. $V_{data}$ is applied to a gate of transistor 12 and $V_{data\#}$ is applied to a gate of transistor 13. By virtue of the configuration, voltage-to-current converter 10 linearly converts the differential voltage signals $V_{data}$ and $V_{data\#}$ to differential current signals $I_{data}$ and $I_{data\#}$.

Differential current signals $I_{data}$ and $I_{data\#}$ are output via drain terminals of transistors 12 and 13, respectively. Taken together, differential current signals $I_{data}$ and $I_{data\#}$ represent a multi-level current signal. The multi-level current signal substantially encodes the data encoded by the multi-level voltage signal input to voltage-to-current converter 10.

Differential current signals $I_{data}$ and $I_{data\#}$ are received from voltage-to-current converter 10 by p-based current mirror 20. Current mirror 20 is adapted to generate a plurality of current signals substantially identical to the received current signals $I_{data}$ and $I_{data\#}$, and to transmit the generated signals to each of three latches 31 through 33. In some embodiments of mirror 20, the generated signals are amplified versions of the received signals. Each differential signal received by a particular latch is a filtered current signal that, in conjunction with its differential counterpart also received by the latch, represents a multi-level current signal. The multi-level current signal substantially encodes data that is also encoded by the multi-level voltage signal input to voltage-to-current converter 10.

Depending on the particular signal levels and particular signaling scheme used, various reference current signals are applied at nodes a through f of latches 31 through 33 by current sources 34 through 39. In one example, current sources 34 through 39 apply reference signals having values of $I_{ref}$, 0, 0, 0, 0, and $I_{ref}$, respectively. An evaluation signal is applied to each latch at an appropriate timing in order to cause the nodes of each latch to substantially equalize to a common voltage. The evaluation signal therefore prepares the latches to compare incoming signals with the reference current signals.

The signals received by each latch, in conjunction with the applied reference current signals, non-linearly force voltages at the nodes to $V_{cc}$ and $V_{ss}$, wherein $V_{cc}$ is the power supply voltage and $V_{ss}$ is the substrate voltage of the chip on which receiver 1 is located. The table below illustrates voltages present at each of nodes a through f for various incoming signal levels, using the multi-level signaling scheme shown in FIG. 1.

| Signal Level | Latch 31 | | | Latch 32 | | | Latch 33 | | |
|---|---|---|---|---|---|---|---|---|---|
| | a | b | Output | c | d | Output | e | f | Output |
| 00 | $V_{ss}$ | $V_{ss}$ | 0 | $V_{ss}$ | $V_{ss}$ | 0 | $V_{ss}$ | $V_{ss}$ | 0 |
| 01 | $V_{ss}$ | $V_{cc}$ | 1 | $V_{ss}$ | $V_{ss}$ | 0 | $V_{ss}$ | $V_{ss}$ | 0 |
| 10 | $V_{ss}$ | $V_{cc}$ | 1 | $V_{ss}$ | $V_{cc}$ | 1 | $V_{ss}$ | $V_{ss}$ | 0 |
| 11 | $V_{ss}$ | $V_{cc}$ | 1 | $V_{ss}$ | $V_{cc}$ | 1 | $V_{ss}$ | $V_{cc}$ | 1 |

Accordingly, the signals generated by each latch serve to indicate a relationship between signals received from current mirror 20 and the reference current signals applied thereto.

Decoder 40 may receive the outputs of latches 31 through 33 and convert the outputs to a data signal that represents data corresponding to signal levels specified by the above table. The corresponding data may represent the data encoded by the multi-level voltage signal input to voltage-to-current converter 10. Since the above outputs of latches 31 through 33 are determinable based simply on the voltages at nodes b, d and f, respectively, decoder 40 may simply receive single-ended inputs from these nodes. Of course, the design of decoder 40 may vary depending upon the latch outputs and the corresponding signal levels specified by a particular signaling scheme and a particular design of receiver 1. According to some embodiments, receiver 1 includes more or less than three latches, and decodes a voltage signal encoding more or less than four signal levels.

Figure 3:
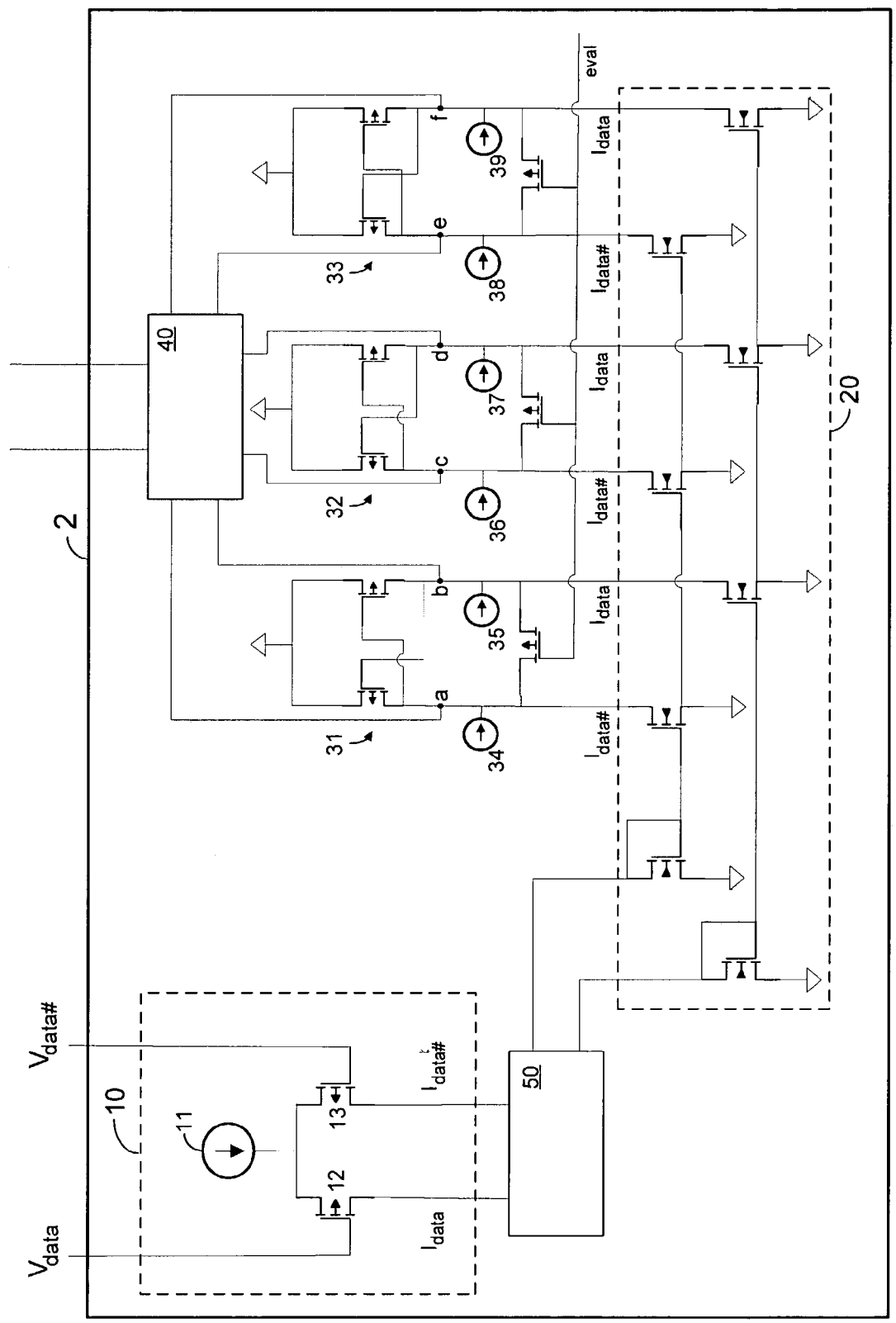
FIG. 3 is a diagram illustrating elements of a multi-level signal receiver according to some embodiments.

FIG. 3 illustrates receiver 2 according to some embodiments. Receiver 2 includes voltage-to-current converter 10, linear filter 50, current mirror 20, latches 31 through 33, and decoder 40. Linear filter 50 may comprise a finite impulse response filter or any other filter that maintains linearity between the multi-level voltage signal represented by differential voltage signals $V_{data}$ and $V_{data\#}$ and the multi-level current signal represented by differential current signals $I_{data}$ and $I_{data\#}$. Inclusion of filter 50 may allow an increase in data rates and may provide receiver-side channel equalization.

Figure 4:
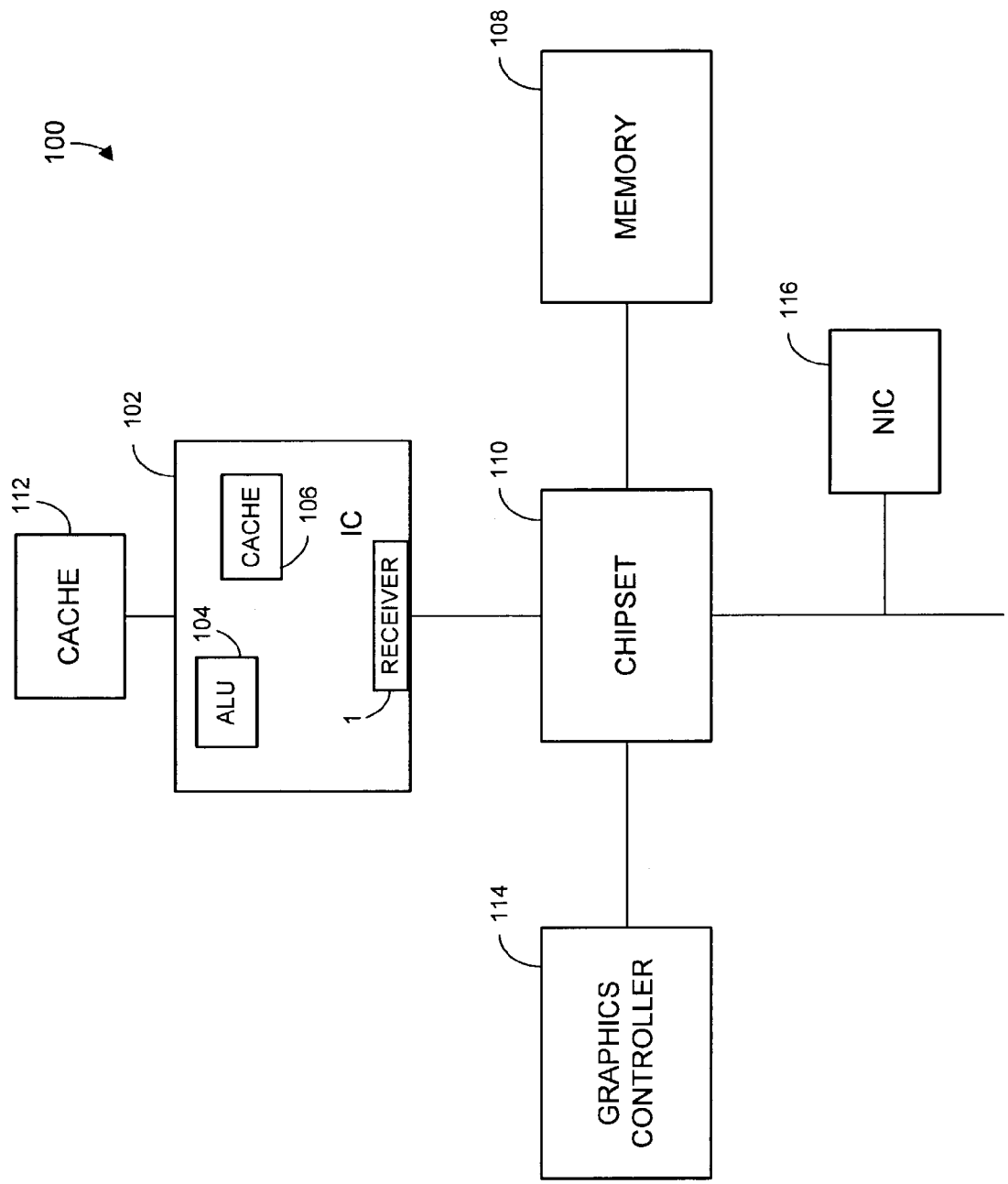
FIG. 4 is a block diagram of a system according to some embodiments.

FIG. 4 illustrates a block diagram of system 100 according to some embodiments. System 100 includes integrated circuit 102 comprising sub-blocks such as arithmetic logic unit (ALU) 104, on-die cache 106 and receiver 1 of FIG. 2. Integrated circuit 102 may be a microprocessor or another type of integrated circuit. Integrated circuit 102 may also communicate with system memory 108 via receiver 1, a host bus and chipset 110. According to some embodiments, integrated circuit 102 also communicates with off-die cache 112 via receiver 1. Other off-die functional units, such as graphics controller 114 and Network Interface Controller (NIC) 116, may communicate with integrated circuit 102 via appropriate busses or ports.

Thus, embodiments may enable high-speed multi-level signaling and may also enable receiver-side equalization.

The several embodiments described herein are solely for the purpose of illustration. For example, although the above embodiments are described in conjunction with differential signaling, some embodiments may be used in conjunction with single-ended and/or pseudo-differential signaling. Embodiments may also include any currently or hereafter-known receivers, voltage-to-current converters, current mirrors and/or latches. Moreover, the ground-referenced PMOS transistors described herein may be substituted with $V_{cc}$-referenced n-channel metal oxide semiconductor transistors, and the current sources may be replaced with current sinks. Therefore, persons skilled in the art will recognize from this description that other embodiments may be practiced with various modifications and alterations.

What is claimed is:

1. A circuit to:
   receive a first half of a differential voltage signal at a first input of a voltage to current converter and a second half of the differential voltage signal at a second input of the voltage to current converter;
   output a multi-level current signal from the voltage to current converter where the multi-level current signal comprises at least a differential current signal;
   generate a plurality of current signals, each of the plurality of current signals substantially identical to the multi-level current signal;
   compare each of the plurality of current signals with a respective one of a plurality of reference current signals; and
   determine data encoded by the multi-level current signal based on the comparisons.

2. A circuit according to claim 1, the circuit to amplify the generated plurality of current signals.

3. A circuit according to claim 1, wherein the multi-level current signal is received from a linear filter.

4. A circuit according to claim 1, the circuit to convert a voltage signal encoding the data to the multi-level current signal.

5. A circuit according to claim 1, wherein the multi-level current signal is a differential-mode signal.

6. The circuit of claim 1, wherein the voltage to current converter comprises a bias current source coupled to a first p-channel metal oxide semiconductor transistor and to a second p-channel metal oxide semiconductor transistor.

7. A circuit comprising:
   a current mirror to receive a multi-level current signal from a voltage to current convertor, and to generate a plurality of current signals substantially identical to the multi-level current signal, wherein the multi-level current signal comprises a differential current signal;
   a plurality of current comparison circuits, each of the plurality of current comparison circuits to receive a respective one of the plurality of generated current signals, to receive a respective reference current signal, and to generate a signal indicating a relationship between the received respective one of the plurality of generated current signals and the respective reference current signal; and
   a decoder to receive the signals generated by each of the plurality of current comparison circuits, and to output a data signal to represent data encoded by the multi-level current signal.

8. A circuit according to claim 7, further comprising:
   a filter to filter the multi-level current signal before the multi-level current signal is received by the current mirror.

9. A circuit according to claim 7, further comprising:
   a voltage-to-current converter to receive a multi-level voltage signal and to convert the voltage signal to the multi-level current signal.

10. A circuit according to claim 7, wherein the multi-level current signal is a differential-mode signal.

11. A method comprising:
    receiving a first half of a differential voltage signal at a first input of a voltage to current converter and a second half of the differential voltage signal at a second input of the voltage to current converter;
    outputting a multi-level current signal from the voltage to current converter where the multi-level current signal comprises at least a differential current signal;
    generating a plurality of current signals, each of the plurality of signals substantially identical to the multi-level current signal;comparing each of the plurality of signals with a respective one of a plurality of reference current signals; and
    determining data encoded by the multi-level current signal based on the comparisons.

12. A method according to claim 11, further comprising:
    filtering the multi-level current signal with a linear filter prior to the generating step.

13. A method according to claim 11, further comprising:
    converting a voltage signal encoding the data to the multi-level current signal.

14. A system comprising:
a chipset; and
a die comprising a microprocessor in communication with the chipset, wherein the microprocessor includes a receiver comprising:
a voltage-to-current converter to convert a differential voltage pair signal to a multi-level current signal;
a current mirror coupled to the converter, the current mirror to receive the multi-level current signal from the voltage to current convertor, and to generate a plurality of current signals substantially identical to the multi-level current signal, wherein the multi-level current signal comprises a differential current signal;
a plurality of current comparison circuits, each of the plurality of current comparison circuits to receive a respective one of the plurality of generated current signals, to receive a respective reference current signal, and to generate a signal indicating a relationship between the received respective one of the plurality of generated current signals and the respective reference current signal; and
a decoder to receive the signals generated by each of the plurality of current comparison circuits, and to output a data signal to represent data encoded by the multi-level current signal.

15. A system according to claim 14, the converter further comprising:
a filter to receive the multi-level current signal and to output a filtered multi-level current signal to the current mirror.

* * * * *